United States Patent [19]
Hori et al.

[11] Patent Number: 5,897,332
[45] Date of Patent: *Apr. 27, 1999

[54] METHOD FOR MANUFACTURING PHOTOELECTRIC CONVERSION ELEMENT

[75] Inventors: Tadashi Hori; Shotaro Okabe, both of Nara; Masahiro Kanai; Akira Sakai, both of Soraku-gun; Yuzo Kohda; Tomonori Nishimoto, both of Tsuzuki-gun; Takahiro Yajima, Soraku-gun, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/717,629

[22] Filed: Sep. 23, 1996

[30] Foreign Application Priority Data

Sep. 28, 1995 [JP] Japan .................................. 7-250709

[51] Int. Cl.⁶ .................................................. H01L 31/075
[52] U.S. Cl. .............................. 438/61; 438/62; 438/96; 438/484; 438/485; 136/258
[58] Field of Search ................................ 438/61–62, 96, 438/484–485; 136/258 AM

[56] References Cited

U.S. PATENT DOCUMENTS

| | | | |
|---|---|---|---|
| 4,400,409 | 8/1983 | Tzu et al. | 438/62 |
| 4,696,881 | 9/1987 | Saitoh et al. | 430/57 |
| 4,728,370 | 3/1988 | Ishii et al. | 136/258 |
| 5,256,576 | 10/1993 | Guha et al. | 438/96 |
| 5,324,364 | 6/1994 | Matsuda et al. | 136/249 |
| 5,571,749 | 11/1996 | Matsuda et al. | 438/484 |

FOREIGN PATENT DOCUMENTS

| | | | |
|---|---|---|---|
| 59-107574 | 6/1984 | Japan | 136/258 AM |
| 62-7172 | 1/1987 | Japan | 136/258 AM |
| 62-60271 | 3/1987 | Japan | 136/258 AM |
| 3-106079 | 5/1991 | Japan | 136/258 AM |

*Primary Examiner*—Nam Nguyen
*Assistant Examiner*—Susy Tsang
*Attorney, Agent, or Firm*—Fitzpatrick, Cella, Harper & Scinto

[57] ABSTRACT

A method for manufacturing a photoelectric conversion element containing at least one pin junction, wherein a diffusion preventing layer is provided between an n-type layer and an i-type layer and/or between an i-type layer and a p-type layer, and the diffusion preventing layer is deposited such that deposition temperature differs in its thickness direction.

60 Claims, 5 Drawing Sheets

FIG. 5 ical conversion element with high energy conversion efficiency but with less degradation with time. Especially, the present invention is suitably applicable to a photoelectric conversion element called a photovoltaic element or a photosensor.

2. Related Background Art

The following technology is known as a conventional method for manufacturing a photovoltaic element, which is one of the above-mentioned photoelectric conversion elements.

U.S. Pat. No. 4,400,409 discloses a continuous plasma CVD system employing the roll-to-roll method. It is understood that this apparatus can continuously manufacture a photovoltaic element having a pin junction by providing a plurality of glow discharge regions and continuously conveying a flexible substrate, having desired width and sufficient length, in the longitudinal direction thereof while depositing a necessary electroconductive semiconductor layer on the substrate in each of the glow discharge regions. In the same apparatus, gas gates are used in order to prevent dopant gas used for manufacturing each semiconductor layer from diffusing and mixing into other glow discharge regions. Specifically, the glow discharge regions are separated from one another by a slit-shaped separation passage and the system further employs means for keeping the separation passages under a flow of scavenging gas, for example, such as Ar or $H_2$.

There are, however, the following problems in the method for forming the films by the above roll-to-roll method and apparatus.

(1) Even if mixing of gasous-state dopants were able to be substantially prevented by separating the formation spaces of the p-type semiconductor layer and the n-type semiconductor layer from the forming space of the i-type semiconductor layer, phosphorus (P) dopant in the n-type semiconductor layer would thermally diffuse into the i-type semiconductor layer, for example, during or after formation of the i-type semiconductor layer on the n-type semiconductor layer, which would weaken the n-i semiconductor junction, thus degrading the open-circuit voltage and fill factor of the photovoltaic element, and consequently, lowering the initial photoelectric conversion efficiency.

(2) Even if the photoelectric conversion efficiency immediately after manufacture was high, the dopant in the p-type semiconductor layer or in the n-type semiconductor layer would gradually thermally diffuse into the i-type semiconductor layer during practical use under various weather and location conditions, thus lowering reliability and promoting degradation of the photovoltaic element.

SUMMARY OF THE INVENTION

An object of the present invention is to provide a method for manufacturing a photoelectric conversion element which reduces dopant diffusion into the i-layer.

Denoting a p-type semiconductor layer, an i-type semiconductor layer, and an n-type semiconductor layer comprised of a non-monocrystal semiconductor by the abbreviations p, i, and n, respectively, the a photoelectric conversion element according to the present invention has a structure comprised of at least one nip junction or pin junction formed on a substrate and is provided with a diffusion preventing layer between the n and i layers and/or between the i and p layers, wherein the diffusion preventing layer is formed at varying temperature in the thickness direction of the diffusion preventing layer.

In the present invention, since the diffusion preventing layer is manufactured at a varying temperature in the thickness direction of the diffusion preventing layer, the diffusion preventing layer can be formed so as to be compatible with the band gaps of the adjacent i-type semiconductor layer, p-type semiconductor layer, and n-type semiconductor layer. As a result, the dopant in the p-type semiconductor layer or in the n-type semiconductor layer can effectively be prevented from thermally diffusing into the i-type semiconductor layer during film formation. Accordingly, the output characteristics, especially, the open-circuit voltage and fill factor, are improved, and as a result, the invention can provide a method for manufacturing the photoelectric conversion element with improved output characteristics.

Furthermore, the present invention permits the diffusion preventing layer to be formed at the p-i interface or at the n-i interface, which can prevent diffusion of dopant under practical use. As a result, degradation of the photoelectric conversion element can be reduced, thus providing a method for manufacturing the photoelectric conversion element with improved reliability.

DESCRIPTION OF THE PREFERRED EMBODIMENTS

Figure 1:
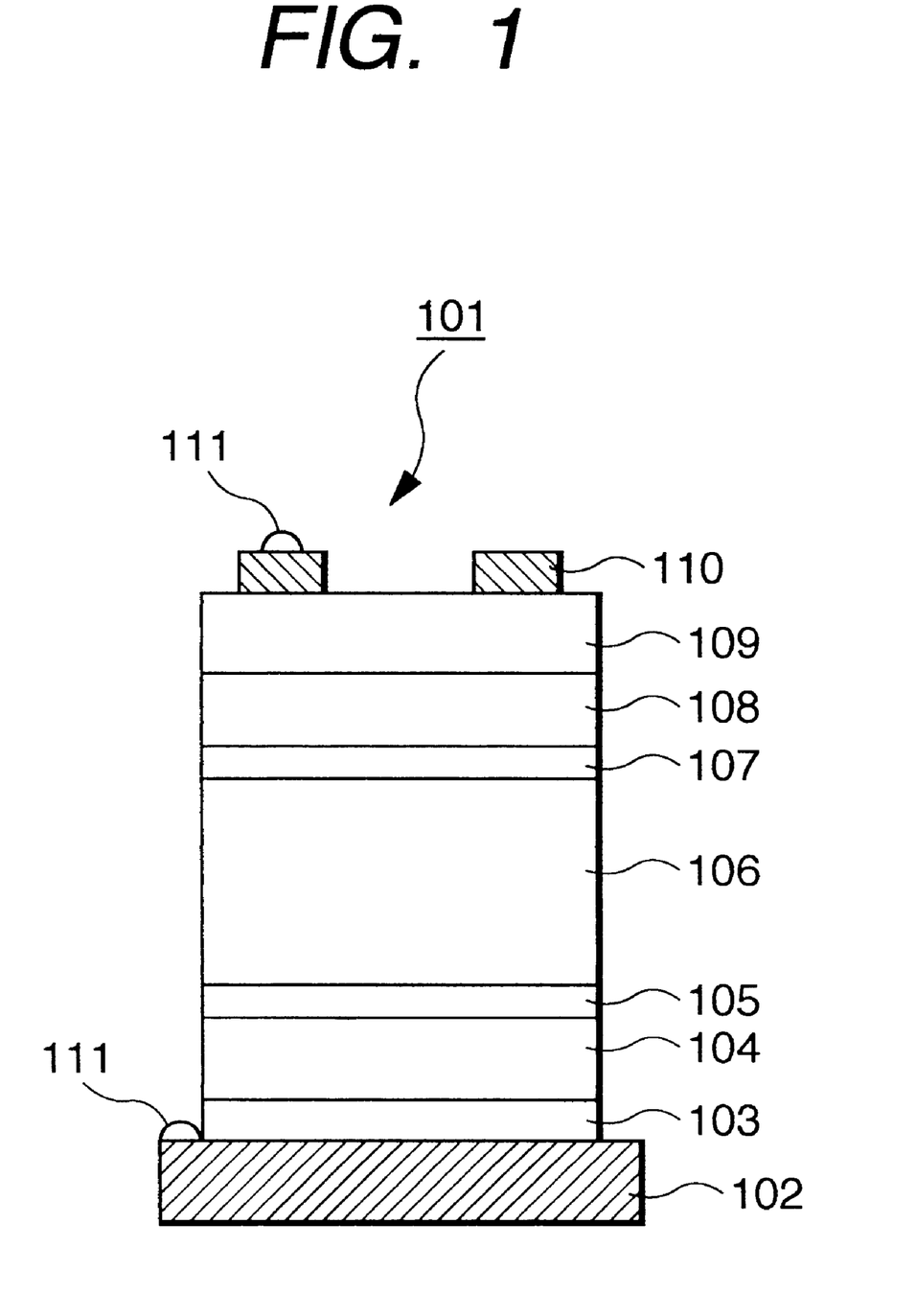
FIG. 1 is a schematic, sectional view showing the layer structure of a non-monocrystal silicon photovoltaic element according to the present invention.

Explained below is the structure of a photovoltaic element, which is an example of a photoelectric conversion element according to the present invention. FIG. 1 is a schematic view showing the typical structure of the photovoltaic element according to the present invention. In FIG. 1, the photovoltaic element 101 comprises a substrate 102, a lower electrode 103, an n-type semiconductor layer 104, an n/i diffusion preventing layer 105, an i-type semiconductor layer 106, a p/i diffusion preventing layer 107, a p-type semiconductor layer 108, a transparent electrode 109, a collector electrode 110, and an output electrode 111. It is assumed in this structure that light is incident through the transparent electrode 109. As compared with the conventional elements, the photovoltaic element of the present invention is greatly different in having the diffusion preventing layers 105, 107 characterized by their manufacturing method.

Diffusion Preventing Layers

The aforementioned problem of "dopant diffusion" is solved by the diffusion preventing layers. Further, the diffusion preventing layers of the present invention are characterized by being formed at a varying temperature in the thickness direction thereof. This is based on the following knowledge.

Since the i-layer needs a relatively large film thickness in general, high film formation rates thus are required from a viewpoint of productivity. Thus, the i-layer is formed at higher formation temperature than the p- and e-layers are.

In order to improve the photoelectric conversion efficiency of the photovoltaic element, a photovoltaic element manufactured with a smooth temperature change at the interface is more preferable than one with a great change of formation temperature at the interface between the diffusion preventing semiconductor layer and the p-type semiconductor layer or the n-type semiconductor layer. This conceivably is because of the effect of relieving structural disorder and stress occurring at the interface between the diffusion preventing layer and the p-type or n-type semiconductor layer, and thus enhancing compatibility at the interface.

Further, the photovoltaic element manufactured with a smooth temperature change at the interfaces is also more preferable in view of improving the reliability of the photovoltaic element compared to one wherein the diffusion preventing layer contacting the p-type or n-type semiconductor layer is formed with a great change of formation temperature at the interfaces. This is presumably because the smooth change of formation temperature at the interface between the diffusion preventing layer and the p-type or n-type semiconductor layer decreases degradation of characteristics due to thermal strain occurring under practical use of the photovoltaic element because of different thermal expansion coefficients between the diffusion preventing layer and the p-type semiconductor layer or n-type semiconductor layer, enhances adhesion between the diffusion preventing layer and the p-type or n-type semiconductor layer so as to reduce peeling and increase bending and impact resistance.

Specific examples of semiconductor materials applicable for forming the diffusion preventing layers (105, 107) include a-Si:H, a-Si:F, A-Si:H:F, a-SiC:H, a-SiC:F, a-SiC:H:F, a-SiGe:H, a-SiGe:F, and a-SiGe:H:F.

Method for Forming the Diffusion Preventing Layers

During formation of the diffusion preventing layer 105 after deposition of the n-layer 104, the temperature is increased gradually from the temperature for forming the n-layer to the temperature for forming the i-layer 106 in a deposition chamber dedicated for the diffusion preventing layer 105. Further, during formation of the diffusion preventing layer 107 after deposition of the i-layer 106, the temperature is decreased gradually from the temperature for forming the i-layer to the temperature for forming the p-layer in a deposition chamber dedicated for the diffusion preventing layer 107.

The methods for forming each semiconductor layer and the diffusion preventing layers according to the present invention can be selected, for example, from the microwave plasma CVD method, the RF plasma CVD method, the ion plating method, the sputtering method, the reactive sputtering method, the photo-assisted CVD method, the thermal CVD method, the MOCVD method, the MBE method, and the HR-CVD method.

In the case of a batch process or in the case of a processing method of intermittently transporting an elongated substrate and keeping it stationary during film formation, the aforementioned temperature change is achieved temporally. Namely, the temperature is increased or decreased gradually during film formation.

In the case of the so-called roll-to-roll method for performing film formation by continuously moving an elongated substrate, the aforementioned temperature change is achieved spatially. The film formation method of the roll-to-roll method will be explained with reference to the drawing.

Figure 2:
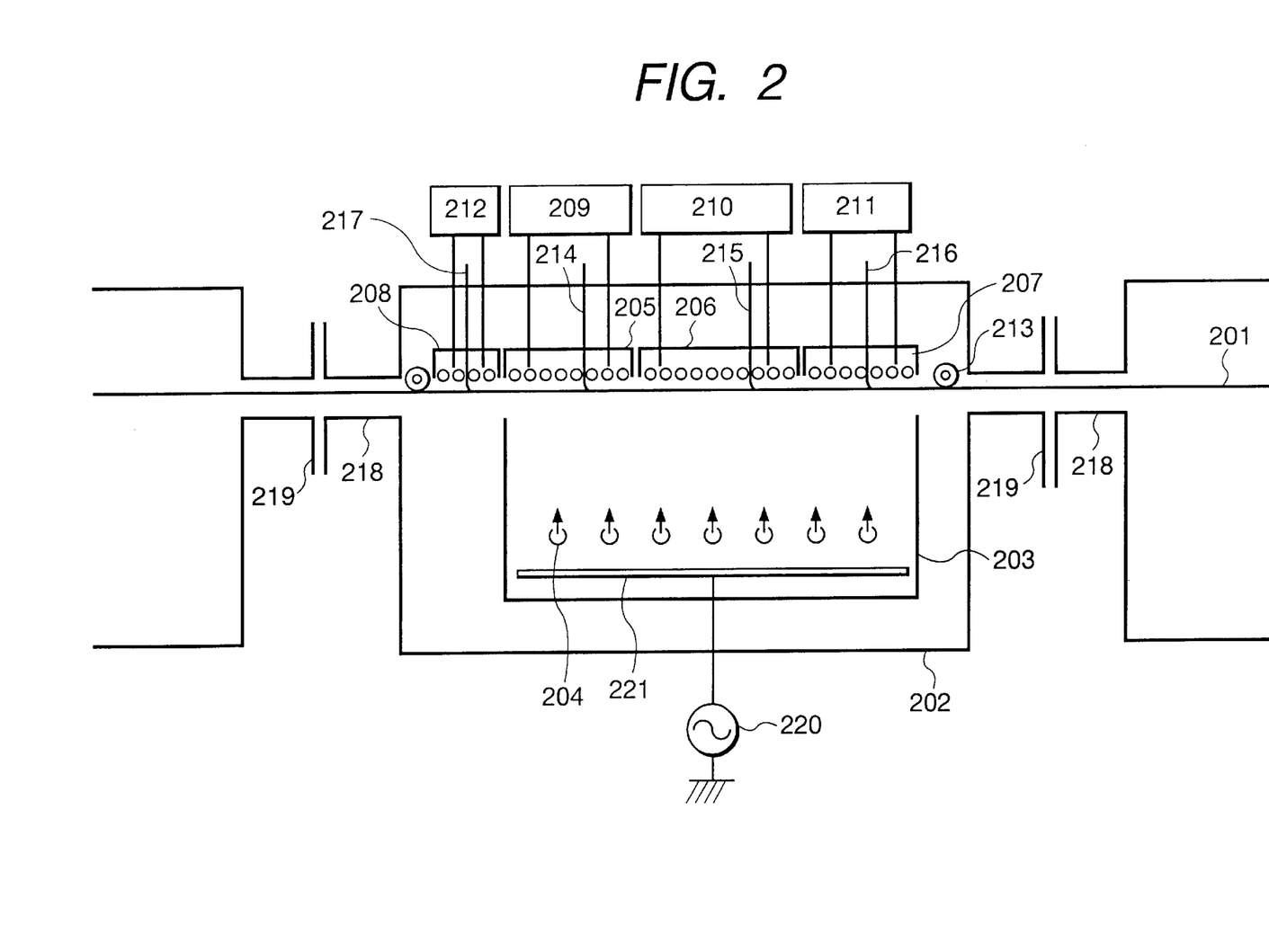
FIG. 2 is a schematic, explanatory drawing showing a chamber for manufacturing the diffusion preventing layer in an apparatus for continuously manufacturing the photovoltaic element according to the present invention.

FIG. 2 shows a chamber 202 for manufacturing the diffusion preventing layer by the radio frequency (RF) CVD method, which comprises a space defined by a container 203 of generally rectangular parallelpiped shape for forming the diffusion preventing layer, and a belt-like member 201. This container for forming the diffusion preventing layer is set in a vacuum chamber 507 for manufacturing the diffusion preventing layer, shown in FIG. 5. The vacuum chamber 202 and film-forming container 203 each are made of metal and are electrically connected to each other.

The belt-like member 201 on which a deposited film is to be formed is introduced through a gas gate 218, provided on the left side of vacuum chamber 202 in the drawing, i.e., attached to an entrance side wall thereof, and is carried through the film-forming container 203 and then to the outside of the vacuum container 202 through a gas gate 218, provided on the right side of vacuum chamber 202 in the drawing, i.e., attached to an exit side wall thereof.

An electrode 221 is set in the film-forming space container and is connected to an RF power supply 220. Gas introducing means 204 for introducing raw material gas is attached to the bottom of the film-forming container 203, and a plurality of gas releasing ports are provided facing toward the belt-like member 201. These gas releasing means are connected to a gas supply means (not shown).

A preheating IR (infrared) lamp heater 208, a preheating thermo-couple 217, and a preheating temperature controller 212 are provided as means for heating the substrate from the back side to achieve the desired film formation temperature. Further, in order to change the temperature during film formation in stages, the apparatus is provided with first, second, and third IR lamp heaters 205, 206, 207, first, second, and third thermo-couples 214, 215, 216, and first, second, and third temperature controllers 209, 210, and 211.

A film becomes deposited on the moving belt-like member 201 as it moves to the right in the drawing. For forming the n/i diffusion preventing layer by this apparatus, the belt-like substrate 201 is preliminarily heated by the heater 208 and then is heated in stages by the heaters 205 to 207. Each heater is controlled by the temperature controller 209 to 211 so as to heat the substrate to a desired temperature.

The p/i diffusion preventing layer is also formed similarly by decreasing the temperature in stages by the heaters each set at desired temperatures. In this way the forming temperature for n/i and for p/i can be changed on a smooth basis.

Roll-to-Roll Manufacturing Apparatus

Figure 5:
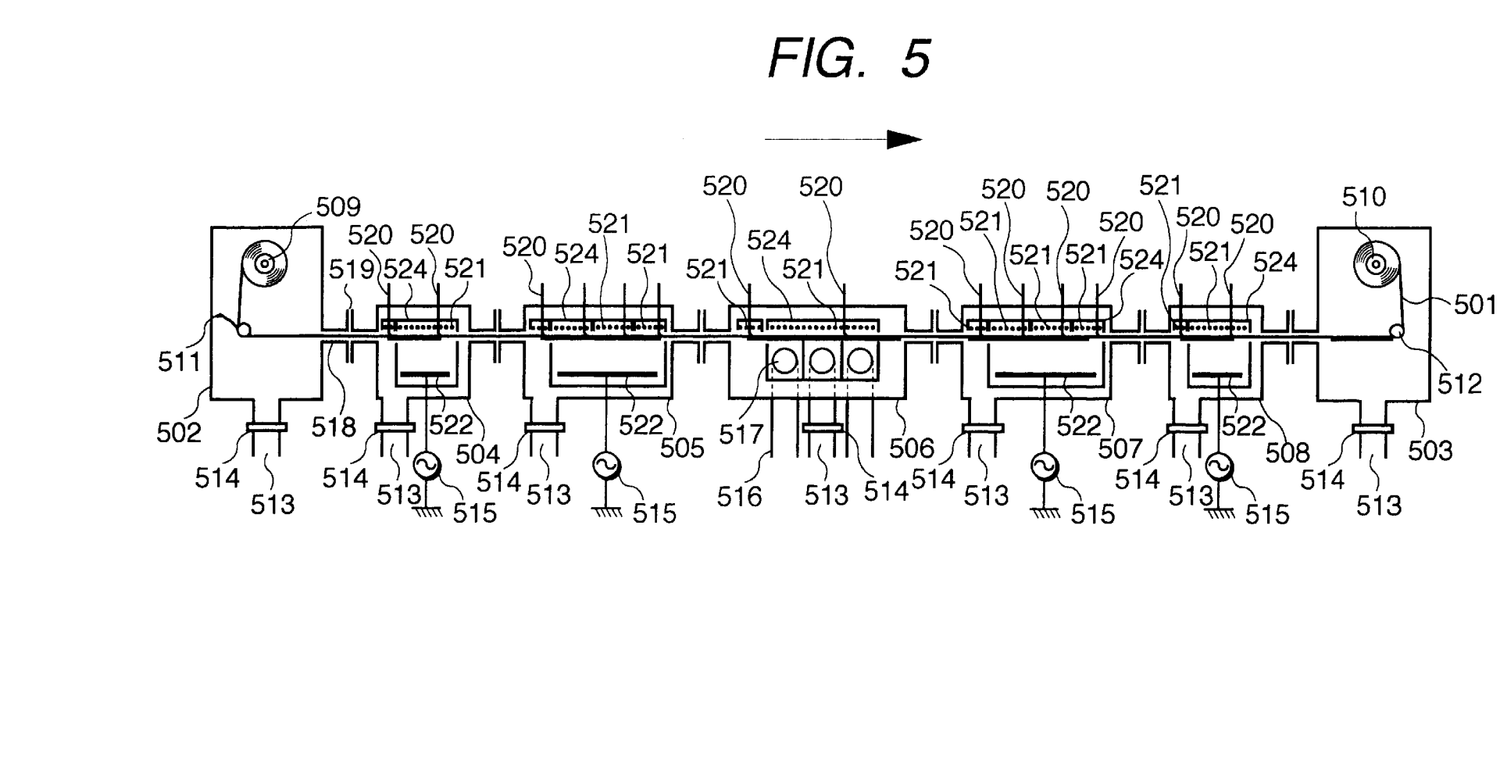
FIG. 5 is a schematic, explanatory drawing showing an example of the apparatus for continuously manufacturing the photovoltaic element according to the present invention.

A continuous manufacturing apparatus of the photovoltaic element comprising the aforementioned diffusion preventing layer forming chambers is shown in FIG. 5.

The apparatus is comprised of feeding chamber 502 and winding chamber 503 for belt-like substrate 501, a chamber 504 for forming the n-type semiconductor layer, chambers 505, 507 for forming the diffusion preventing layers, a chamber 506 for manufacturing the i-type semiconductor layer, and a chamber 508 for manufacturing the p-type semiconductor layer, which are connected through gas gates 518. Numeral 509 designates a bobbin for feeding the belt-like substrate 501, and 510 a bobbin for winding up the belt-like substrate 501. The belt-like substrate 501 is conveyed in the arrow direction in the drawing. However, the belt-like substrate 501 can also be conveyed in the opposite direction.

The apparatus may also comprise inter-leaved winding and feeding means used for surface protection of the belt-like substrate 501 in the feeding chamber 502 and in the winding chamber 503. Materials suitably used for the inter-leaf include polyimide-based heat-resistant resins, Teflon-based materials, glass wool, and the like. Numerals 511, 512 denote conveying rollers also serving as means for tension adjustment and positioning of the belt-like substrate 501. Numeral 514 represents a throttle valve for adjustment of exhaust, and 513 an exhaust pipe, connected to an exhaust pump (not shown). Numeral 517 denotes an applicator, to the tip of which a microwave-transmissive member is attached and which is connected through a waveguide tube 516 to a microwave power supply (not shown). Numeral 522 denotes an electrode, which is connected to an RF power supply 515.

In each film-forming chamber 504, 505, 506, 507, 508, a plurality of IR lamp heaters 521, and lamp house 524 for efficiently concentrating radiant heat from the IR lamp heaters onto the belt-like substrate 501 are provided in a space opposite to the film-forming space with the belt-like substrate 501 in between. Further, thermo-couples 520 for monitoring the temperature of the belt-like substrate 501 are connected each in contact with the belt-like substrate 501.

In the case where microwave CVD is used for film formation, a bias voltage may be applied in order to control the plasma potential of the microwave plasma appearing in the film-forming space. The bias voltage is preferably DC, pulsating, or AC voltage applied alone or in superposition. Control of the plasma potential of the microwave plasma can improve stability and reproducibility of the plasma and film characteristics, and can decrease defects.

When the photovoltaic element is manufactured using the above apparatus for continuously manufacturing the photovoltaic element according to the present invention, the aforementioned various problems can be solved and the aforementioned various requirements can be met, whereby a photovoltaic element with high quality and excellent uniformity and with less defects can be manufactured on the continuously moving belt-like substrate.

Other Constituent Elements

The other constituent elements besides the diffusion preventing layers in the photovoltaic element (FIG. 1) of the present invention will now be explained.

Substrate

An electroconductive belt-like substrate is preferably used as the substrate 102 according to the present invention. The material of the electroconductive belt-like substrate can preferably be selected from those having desired strength with little deformation and distortion at temperatures necessary for manufacturing the semiconductor layers; specifically, thin metal plates of stainless steel, aluminum and alloys thereof, iron and alloys thereof, copper and alloys thereof, and the like; composites of the foregoing materials; and the foregoing materials the surface of which is coated with a metal thin film of another material or with an insulating thin film of $SiO_2$, $Si_3N_2$, $Al_2O_3$, $AlN_3$ or the like by a surface coating treatment such as the sputtering method, the evaporation method, the plating method, or the like. Further, the material can also be selected from heat-resistant resin sheets of polyimide, polyamide, polyethylene terephthalate, epoxy, and the like, or composites thereof with glass fiber, carbon fiber, boron fiber, metal fiber, or the like, the surface of which is subjected to an electroconductive treatment with a metal, an alloy, transparent conductive oxide (TCO), or the like by a method such as plating, evaporation, sputtering, coating, or the like.

The thickness of the belt-like electroconductive substrate is preferably as thin as possible, taking account of cost, storage space, and so on, within the range in which the substrate can demonstrate the strength to be maintained upon conveyance by the foregoing conveying means. Specifically, the thickness is preferably between 0.01 mm and 5 mm, more preferably between 0.02 mm and 2 mm, and most preferably between 0.05 mm and 1 mm. When a thin film of metal or the like is used, desired strength can readily be achieved even with the thickness being decreased to a relatively thin level.

There is no specific limitation on the width of the electroconductive belt-like substrate, and the width is determined depending upon the size of the semiconductor layer manufacturing means, the container thereof, and the like.

There is no specific limitation on the length of the electroconductive belt-like substrate. The length may be as long as just wound in a roll form, or elongated substrates may be further elongated by welding or the like. As for the surface properties of the electroconductive belt-like substrate, the surface may be a smooth surface or a finely roughened surface. In the case of the finely roughened surface, roughness is preferably in the shape of a sphere, circular cone, pyramid, or the like and with maximum height ($R_{max}$) being 50 nm to 500 nm, whereby reflection of light on the surface becomes irregular so as to increase the optical path length of the reflected light on the surface.

Electrodes

Depending upon the structure and configuration of device, the lower electrode, upper electrode (transparent electrode), and collector electrode can be chosen as occasion demands, as the electrodes according to the present invention (provided that the upper electrode stated herein means an electrode provided on the light incidence side while the lower electrode means an electrode provided opposed to the upper electrode with the semiconductor layers inbetween).

A suitable material for making the lower electrode 103, may be selected, for example, from metals such as Ag, Au, Pt, Ni, Cr, Al, Ti, Zn, Mo, W, and the like or alloys thereof. The lower electrode can be made of either one of these metals and by film-forming means such as vacuum evaporation, electron beam evaporation, or sputtering. Care is needed so that the formed metal thin film formed does not become a resistive component to the output of the photovoltaic element. Namely, the sheet resistance is preferably not more than 50 Ω and more preferably, not more than 10 Ω.

Although not shown, a buffer layer for preventing short circuits and for preventing diffusion of the electrode metal, such as ZnO or the like, may be provided between the lower electrode 103 and the n-type semiconductor layer (or the p-type semiconductor layer) 104. Effects of the buffer layer include not only prevention of the metal element forming the lower electrode 103 from diffusing into the n-type semiconductor layer (or the p-type semiconductor layer), but also prevention of short circuits occurring due to a defect such as a pinhole between the lower electrode 103 and the upper (transparent) electrode 109 with the semiconductor layers inbetween by providing a small resistance, and to confine the incident light by causing multiple interference by the thin film in the photovoltaic element.

Materials suitable for the buffer layer include magnesium fluoride based materials; oxides, nitrides, and carbides of indium, tin, cadmium, zinc, antimony, silicon, chromium, silver, copper, and aluminum; or mixtures thereof. Especially, magnesium fluoride and zinc oxide are desirable as a buffer layer because of easy formation, and possession of moderate resistance and light transmittance.

The transparent electrode 109 employed in the present embodiment desirably has a transmittance of light of not less than 70% in order to provide efficient absorption of light from the sun, white fluorescent tube, or the like in the semiconductor layers, and further, the transmittance desirably is not less than 80%. Materials having such characteristics include metal oxides such as $SnO_2$, $In_2O_3$, ZnO, CdO, $Cd_2SnO_4$, ITO ($In_2O_3$+$SnO_2$), and the like; metal thin films which are very thin and translucent, formed of the metals such as Au, Al, Cu, or the like. In the case of the photovoltaic element constructed in the structure shown in FIG. 1, the transparent electrode is stacked on the p-type semiconductor layer (or the n-type semiconductor layer) 108. The resistance heating evaporation method, the sputtering method, the spray method, or the like can be used as a manufacturing method of the electrode, and is selected as occasion demands.

The collector electrode 110 used in the present invention is provided on the transparent electrode 109 in order to decrease the sheet resistance of the transparent electrode 109. In the photovoltaic element in the structure as shown in FIG. 1, because the transparent electrode is formed after formation of the semiconductor layers, the substrate temperature upon formation of the transparent electrode cannot be increased too high, which would inevitably result in the transparent electrode having relatively high sheet resistance. Therefore, formation of the collector electrode 110 is especially preferred.

A material for making the collector electrode, suitably applicable to the photovoltaic element of the present invention, may be selected from simple metals such as Ag, Cr, Ni, Al, Au, Ti, Pt, Cu, Mo, W, and the like; alloys thereof; or carbon. Further, the advantages of these metals or carbon (low resistance, less diffusion into the semiconductor layer, good quality, ease of formation of the electrode by printing, etc.) can be used in combination. In order to secure a sufficient quantity of incident light into the semiconductor layers, the shape of the collector electrode is preferably one which uniformly spreads out on the light receiving surface of photovoltaic element and the area thereof is preferably not more than 15% of the light receiving area, and more preferably, not more than 10%. The sheet resistance of the collector electrode is preferably not more than 50 Ω and more preferably, not more than 10 Ω.

Semiconductor Layers

The semiconductor layers according to the present invention are generally separated into the i-type semiconductor layer, the p-type semiconductor layer, the n-type semiconductor layer, and the diffusion preventing layers.

A semiconductor material for making the i-type semiconductor layer may be selected from so-called Group IV based and Group IV alloy based semiconductor materials such as a-Si:H, a-Si:F, a-Si:H:F, a-SiC:H, a-SiC:F, aSiC:H:F, a-SiGe:H, a-SiGe:F, a-SiGe:H:F, polycrystal Si:H, polycrystal Si:F, or polycrystal Si:H:F. The amount of hydrogen atoms contained in the i-type semiconductor layer is preferably not more than 20 atom % and more preferably, not more than 10 atom %.

A semiconductor material for making the p-type or n-type semiconductor layer suitably applied in the present invention is obtained by doping the semiconductor material for forming the i-type semiconductor layer as described above with a valence electron control agent. The semiconductor material for making the p-type or n-type semiconductor layer preferably contains crystals, because the utilization factor of light and the carrier density can be enhanced thereby. The concentration of hydrogen contained in the p-type or n-type semiconductor layer is preferably not more than 5 atom % and more preferably, not more than 1 atom %.

The raw material gas used in forming these semiconductor layers is selected from constituent elements of the above semiconductor layers, hydrides thereof, halides thereof, organic metal compounds etc., which can be introduced in a gaseous state into the film-forming space.

Of course, these raw material gases can be used not only singly, but also in the form of a mixture of two or more gases. Further, these raw material gases may be introduced in mixture with, for example, a rare gas such as He, Ne, Ar, Kr, Xe, or Rn, a diluent gas such as $H_2$, HF, or HCl, or the like.

EXAMPLES

Five examples will be described.

(1) Photovoltaic element shown in FIG. 1
(2) Photovoltaic element formed under formation conditions modified from those of (1)
(3) Triple type Photovoltaic element
(4) Photovoltaic element formed using a-SiGe instead of a-Si for the n/i diffusion preventing layer in (3)
(5) Photovoltaic element formed using a-SiGe instead of a-Si for the p/i diffusion preventing layer in (3)

Example 1

The Photovoltaic element shown in FIG. 1 was prepared using the roll-to-roll system of FIG. 5.

(1) A bobbin 509 was installed in the vacuum chamber 502 having the substrate feeding mechanism, around which the belt-like substrate 501 of SUS 430 BA (300 mm wide× 300 m long×0.2 mm thick) with a sputtered silver thin film of 100 nm and a ZnO thin film of 1 $\mu$m as a lower electrode, after sufficient degreasing and washing. The belt-like substrate 501 was threaded through the n-type semiconductor layer forming chamber, the diffusion preventing layer forming chamber, the i-type semiconductor layer forming chamber, the diffusion preventing layer forming chamber, and the p-type semiconductor layer forming chamber via the gas gates up to the vacuum chamber 503 having the winding mechanism of the belt-like substrate, and the tension thereon was adjusted so as to remove slack.

(2) Each vacuum chamber 502, 503, 504, 505, 506, 507, 508 was evacuated down to $1\times10^{-6}$ or less Torr by means of a vacuum pump (not shown).

(3) Heat treatment before film formation: $H_2$ was flowed at 500 cc/min as a gate gas through each gate gas inlet tube 519 into the gas gate 518, He was introduced at 500 cc/min into each film-forming chamber through the gas inlet tube (not shown), and the valve travel of the throttle valve 514 was adjusted and each vacuum chamber was evacuated by a vacuum pump (not shown) through the exhaust pipe 513 of each vacuum chamber so as to keep the interior pressure of each vacuum chamber 502, 503, 504, 505, 506, 507, 508 at 1.0 Torr. Then the belt-like substrate and the members inside the vacuum chambers were heated at 400° C. by the lamp heaters 521, and the system was let to stand in this state for one hour.

(4) Each vacuum chamber 502, 503, 504, 505, 506, 507, 508 was evacuated down to $1\times10^{-6}$ or less Torr by means of a vacuum pump (not shown).

(5) Introduction of gate gas upon film formation: $H_2$ was introduced at 600 cc/min as a gate gas into each gas gate 518 through the gate gas inlet tube.

Figure 4:
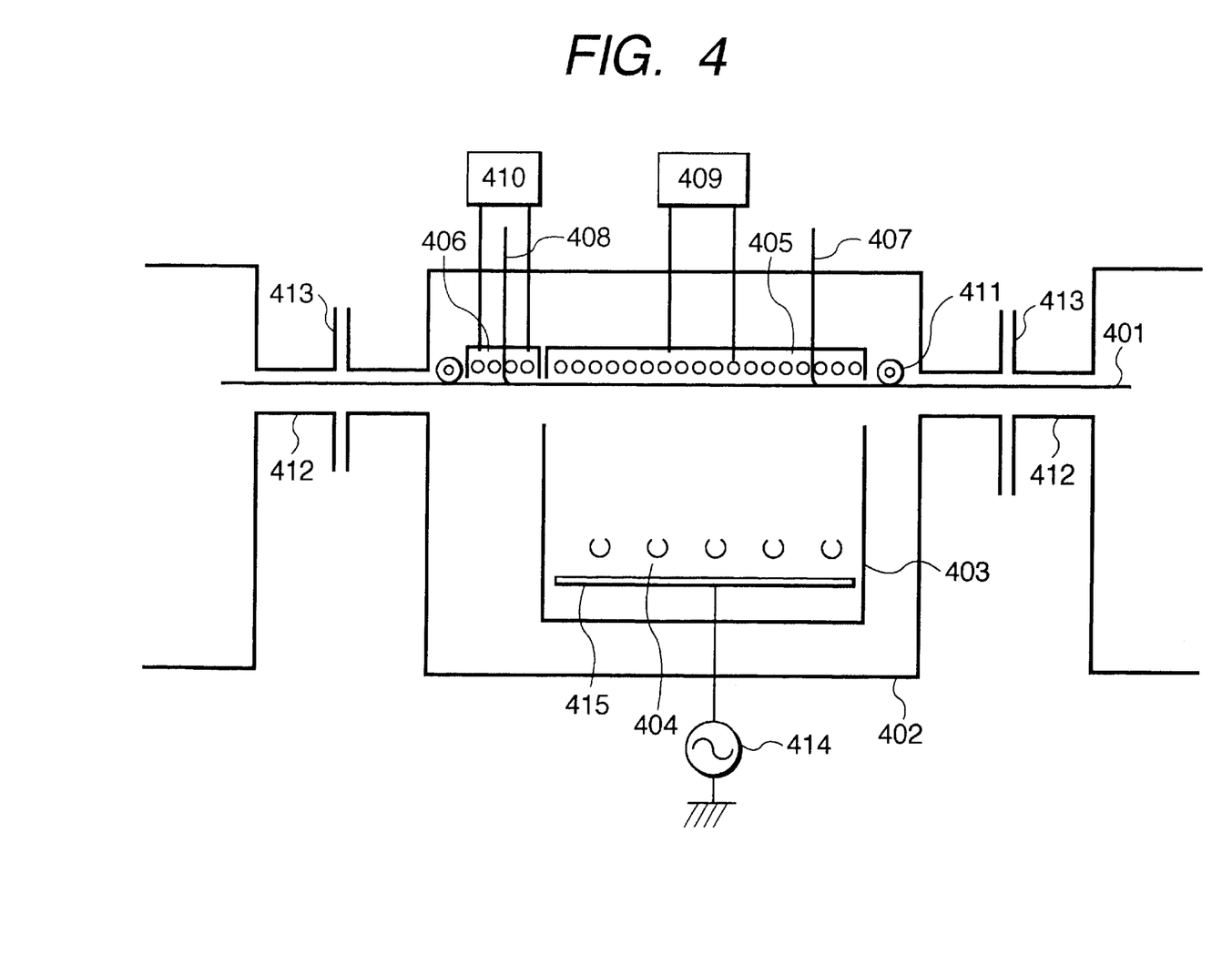
FIG. 4 is a schematic, explanatory drawing showing a chamber for manufacturing the p-type semiconductor layer or the n-type semiconductor layer in the apparatus for continuously manufacturing the photovoltaic element according to the present invention.

(6) Preparation for formation of the n-type semiconductor layer: The n-layer was formed by the RF-CVD apparatus shown in FIG. 4. A preheating temperature controller 410 was adjusted and the belt-like substrate 401 was heated by an IR lamp heater for preheating so that the temperature indicated by the preheating thermo-couple 408 was 250° C. Similarly, a first temperature controller 409 was adjusted and the belt-like substrate 401 was heated by a first IR lamp heater 406 so that a temperature indicated by the first thermo-couple 407 was 270° C. From gas introducing means (not shown), $SiH_4$ gas was introduced at 100 cc/min, $PH_3/H_2$ (1%) gas at 500 cc/min, and $H_2$ gas at 700 cc/min. The valve travel of a throttle valve (not shown) was controlled and discharge chamber 403 was evacuated through an exhaust pipe (not shown) by means of a vacuum pump (not shown) so that the pressure in the discharge chamber 403 became 1.0 Torr. RF power supply 414 was adjusted so that the output thereof became 100 W. thereby causing discharge in the discharge chamber 403 through the electrode 404.

(7) Preparation for formation of the n/i diffusion preventing layer: The n/i diffusion preventing layer was formed by the RF-CVD apparatus of FIG. 2. The preheating temperature controller 211 was adjusted and the belt-like substrate 201 was heated by the preheating IR lamp heater 208 so that the temperature indicated by the preheating thermo-couple 217 was 260° C. The first temperature controller 209 was adjusted and the belt-like substrate 201 was heated by the first IR lamp heater 205 so that the temperature indicated by the first thermo-couple 214 was 260° C. The second temperature controller 210 was adjusted and the belt-like substrate 201 was heated by the second IR lamp heater 206 so that the temperature indicated by the second thermo-couple 215 was 300° C. The third temperature controller 211 was adjusted and the belt-like substrate 201 was heated by the third IR lamp heater 207 so that the temperature indicated by the third thermo-couple 216 was 350° C. From gas introducing means (not shown), $SiH_4$ gas was introduced at 50 cc/min and $H_2$ gas at 1000 cc/min. The valve travel of the throttle valve (not shown) was controlled and the discharge chamber 203 was evacuated by means of a vacuum pump (not shown) through the exhaust pipe (not shown) so that the pressure in the discharge chamber 203 became 1.1 Torr. The RF power supply 220 was adjusted so that the output value thereof was 50 W, thereby causing discharge in the discharge chamber 203 through the electrode 221.

(8) Preparation for formation of the i-type semiconductor layer: The preheating temperature controller (not shown) was adjusted and the belt-like substrate 501 was heated by the preheating IR lamp heater 524 so that the temperature indicated by the preheating thermo-couple 521 was 350° C. Similarly, the first temperature controller (not shown) was adjusted and the belt-like substrate 501 was heated by the first IR lamp heater 524 so that the temperature indicated by the first thermo-couple 520 was 360° C.

Figure 3:
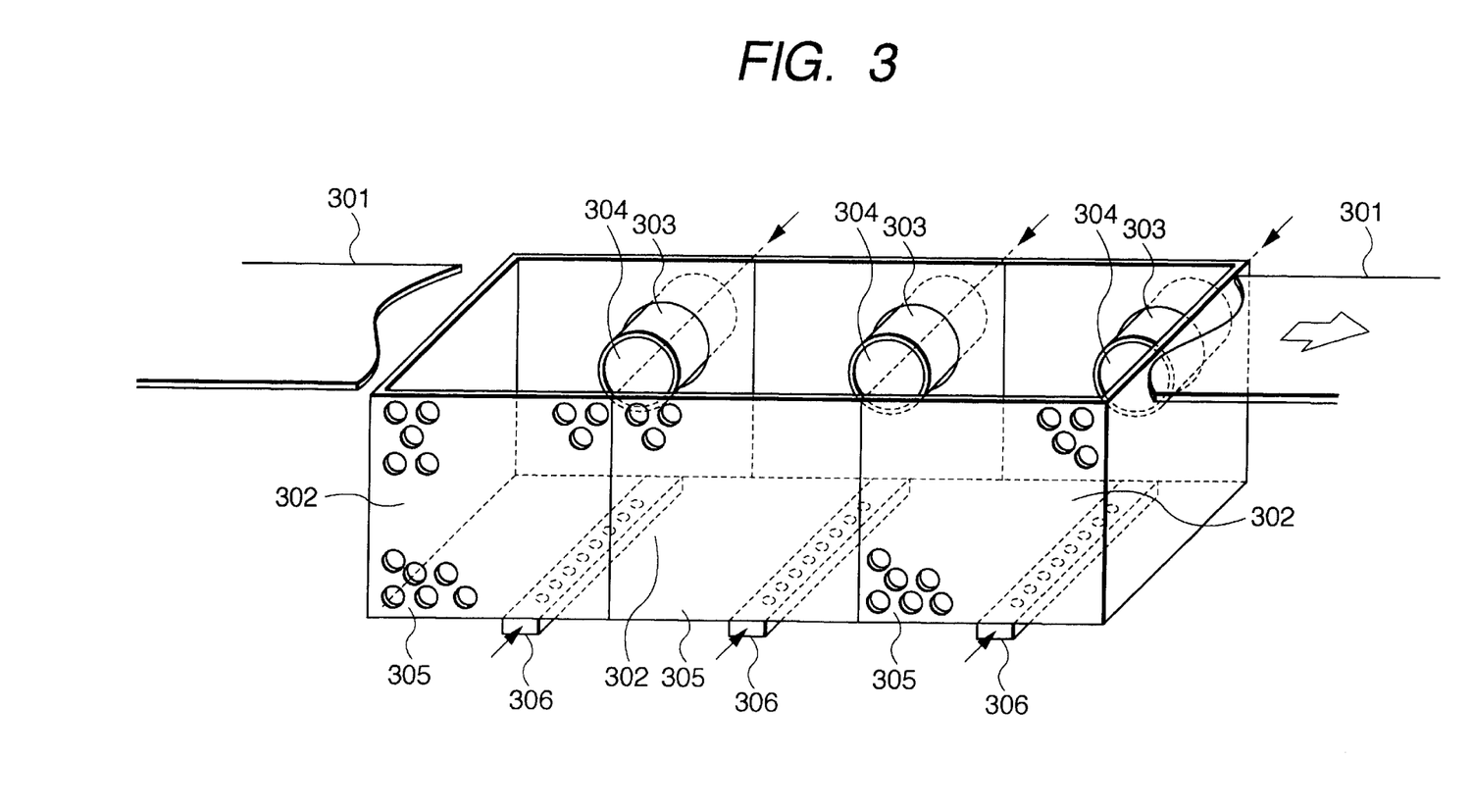
FIG. 3 is a schematic, explanatory drawing showing a chamber for manufacturing the i-type semiconductor layer in the apparatus for continuously manufacturing the photovoltaic element according to the present invention.

The i-layer was formed by the microwave CVD apparatus shown in FIG. 3. Through gas inlet pipes 306, $SiH_4$ gas was introduced at 50 cc/min, $GeH_4$ gas at 50 cc/min, and $H_2$ gas at 200 cc/min. The valve travel of a throttle valve (not shown) was controlled and the discharge chamber was evacuated by means of a vacuum pump (not shown) through perforated exhaust board 305 and exhaust pipe (not shown) so that the pressure inside the discharge chamber became 20 mTorr. Microwave power was guided to applicators 303 (in FIG. 5, 517) and the microwave power was introduced at 200 W, 200 W, and 200 W through respective microwave-transmissive members 304 into the discharge chamber, thus causing discharge therein.

(9) Preparation for formation of the p/i diffusion preventing layer: The p/i diffusion preventing layer was formed by the RF-CVD apparatus of FIG. 2. The preheating temperature controller 212 was adjusted and the belt-like substrate 201 was heated by the preheating IR lamp heater 208 so that the temperature indicated by the preheating thermo-couple 217 was 360° C. The first temperature controller 209 was adjusted and the belt-like substrate 201 was heated by the first IR lamp heater 205 so that the temperature indicated by the first thermo-couple 214 was 360° C. The second temperature controller 210 was adjusted and the belt-like substrate 201 was heated by the second IR lamp heater 206 so that the temperature indicated by the second thermo-couple 215 was 280° C. The third temperature controller 211 was adjusted and the belt-like substrate 201 was heated by the third IR lamp heater 207 so that the temperature indicated by the third thermo-couple 216 was 200° C. From the gas introducing means (not shown), $SiH_4$ gas was introduced at 20 cc/min and $H_2$ gas at 900 cc/min. The valve travel of the throttle valve (not shown) was controlled and the discharge chamber 203 was evacuated by means of a vacuum pump (not shown) through the exhaust pipe (not shown) so that the pressure in the discharge chamber 203 became 1.1 Torr. The RF power supply 220 was adjusted so that the output thereof was 90 W, thereby causing discharge in the discharge chamber 203 through the electrode 221.

(10) Preparation for formation of the p-type semiconductor layer: The p-layer was formed by the RF-CVD apparatus of FIG. 4. The preheating temperature controller 410 was adjusted and the belt-like substrate 401 was heated by the preheating IR lamp heater so that the temperature indicated by the preheating thermo-couple 408 was 150° C. Similarly, the first temperature controller 409 was adjusted and the belt-like substrate 401 was heated by the first IR lamp heater 406 so that the temperature indicated by the first thermo-couple 407 was 150° C. From the gas introducing means (not shown), $SiH_4$ gas was introduced at 10 cc/min, $BF_3/H_2$ (1%) gas at 50 cc/min, and $H_2$ gas at 1000 cc/min. The valve travel of the throttle valve (not shown) was controlled and the discharge chamber was evacuated by means of a vacuum pump (not shown) through the exhaust pipe (not shown) so that the pressure in the discharge chamber 403 was 1.0 Torr. The RF power supply 414 was adjusted so that the output value thereof was 1000 W, thus causing discharge in the discharge chamber 403 through the electrode 404.

(11) The belt-like substrate 501 was conveyed at a speed of 1000 mm/min in the direction of the arrow in the drawing, so as to form the n-type semiconductor layer, n/i diffusion preventing layer, i-type semiconductor layer, p/i diffusion preventing layer, and p-type semiconductor layer on the belt-like substrate.

(12) After the roll of the belt-like substrate had been conveyed through the apparatus, all plasma, all gas supply, energization of all lamp heaters, and conveyance of the belt-like substrate were stopped. Then $N_2$ gas for chamber leaking was introduced into the chambers (introducing members thereof are not shown) to change the pressure back to atmospheric pressure, and the belt-like substrate wound around the winding bobbin was removed from the apparatus.

(13) As a transparent electrode, ITO ($In_2O_3+SnO_2$) was evaporated over the p-type semiconductor layer in a thickness of 100 nm by vacuum evaporation, and Al was vacuum evaporated thereon as a collector electrode in a 1 $\mu$m thickness, thereby fabricating the photovoltaic element (sample No. 1) shown in FIG. 1.

The above manufacturing conditions of the photovoltaic element are shown in Table 1.

TABLE 1

| Substrate | SUS 430 BA W: 300 mm T: 0.2 mm |
| --- | --- |
| Reflective layer | silver (Ag) thin film 100 nm |
| Reflection enhancing layer | zinc oxide (ZnO) thin film 1 $\mu$m |
| Gate gas | $H_2$ from each gate at 500 cc/min |

| Name of layer | | | flow rate (cc/min) | discharge power (W) | press (Torr) | substrate temperature (° C.) |
| --- | --- | --- | --- | --- | --- | --- |
| Manufacturing conditions of each layer | n layer | $SiH_4$ | 100 | 100 (RF) | 1.0 | 270 |
| | | $PH_3/H_2$ (1% dil) | 500 | | | |
| | | $H_2$ | 700 | | | |
| | n/i diffusion preventing layer | $SiH_4$ | 50 | 50 (RF) | 1.1 | 280 |
| | | $H_2$ | 1000 | | | 300 |
| | | | | | | 350 |
| | i layer | $SiH_4$ | 50 | 200 | 0.02 | 360 |
| | | $GeH_4$ | 50 | 200 ($\mu$-wave) | | |
| | | $H_2$ | 200 | 200 | | |
| | p/i diffusion preventing layer | $SiH_4$ | 20 | 50 (RF) | 1.1 | 350 |
| | | $H_2$ | 900 | | | 280 |
| | | | | | | 200 |
| | p layer | $SiH_4$ | 10 | 1000 (RF) | 1.0 | 150 |
| | | $BF_3/H_2$ (1% dil) | 50 | | | |
| | | $H_2$ | 1000 | | | |

Transparent electrode ITO ($In_2O_3 + SnO_2$) thin film 100 nm
Collector electrode aluminum (Al) thin film 2 $\mu$m Comparative Example 1

This example is different from Example 1 in that the heating temperature of the belt-like substrate is kept constant during formation of the diffusion preventing layer.

Differences from Example 1 are as follows.

(1) The heating temperature of the belt-like substrate was kept constant at 300° C. during formation of the n/i diffusion preventing layer.

(2) The heating temperature of the belt-like substrate was kept constant at 280° C. during formation of the p/i diffusion preventing layer.

A photovoltaic element (comparative sample No. 1) was fabricated on a roll of belt-like substrate in the same manner as in Example 1 except for the above differences.

Next described is the result of evaluation of the photoelectric conversion efficiency, $\eta$={maximum generated power per unit area (mW/cm$^2$)/intensity of incident light per unit area (mW/cm$^2$)}, carried out on each of the photovoltaic elements (sample No. 1) obtained in Example 1 and the photovoltaic elements (comparative sample No. 1) obtained in Comparative Example 1.

Five samples were prepared for each of the photovoltaic elements of sample No. 1 and comparative sample No. 1, and they were placed under irradiation of light of AM-1.5 (100 mW/cm$^2$).

A DC voltage was applied to the output electrode 110 shown in FIG. 1 to measure current-voltage performance, thereby evaluating the open-circuit voltage, fill factor, and photoelectric conversion efficiency n. As a result, the photovoltaic element of sample No. 1 showed an open-circuit voltage 1.14 times on average, a fill factor 1.1 times on average, and a photoelectric conversion efficiency $\eta$ 1.25 times on average greater than the photovoltaic element of comparative sample No. 1. Thus, the photovoltaic element of sample No. 1 was improved in all characteristics.

Further, each of the photovoltaic elements manufactured in Example 1 and the photovoltaic elements (comparative sample No. 1) manufactured in Comparative Example 1 was vacuum-sealed by a protective film comprised of polyvinylidene fluoride (VDF). Then they were placed under conditions of practical use (placed outdoors with a fixed resistance of 50 ohm connected across both electrodes) for one year, and thereafter the evaluation of photoelectric conversion efficiency was again carried out to check the rate of degradation (which is obtained by dividing the amount of photoelectric conversion efficiency lost due to degradation by the initial photoelectric conversion efficiency) caused by irradiation of light. As a result, the degradation rate of sample No. 1 was 40% of that of comparative sample No. 1.

The above showed that the photovoltaic element manufactured according to the present invention (sample No. 1 of Example 1) had a significantly improved photoelectric conversion efficiency and greatly improved reliability under conditions of practical use.

Example 2

This example is different from Example 1 in that the diffusion preventing layers were fabricated under the formation conditions shown in Table 2. The photovoltaic elements (sample No. 2) were fabricated on a roll of belt-like substrate in the same manner as in Example 1 except for the aforementioned difference.

TABLE 2

| Substrate | SUS 430 BA W: 300 mm T: 0.2 mm |
| --- | --- |
| Reflective layer | silver (Ag) thin film 100 nm |
| Reflection enhancing layer | zinc oxide (ZnO) thin film 1 $\mu$m |
| Gate gas | $H_2$ from each gate at 500 cc/min |

| Name of layer | | | flow rate (cc/min) | discharge power (W) | press (Torr) | substrate temperature (° C.) |
| --- | --- | --- | --- | --- | --- | --- |
| Manufacturing conditions of each layer | n layer | $SiH_4$ | 100 | 100 (RF) | 1.0 | 340 |
| | | $PH_3/H_2$ (1% dil) | 500 | | | |
| | | $H_2$ | 700 | | | |
| | n/i | $SiH_4$ | 50 | 50 (RF) | 1.1 | 360 |

TABLE 2-continued

| | | | | | |
|---|---|---|---|---|---|
| diffusion preventive layer | $GeH_2$<br>$H_2$ | 50<br>1000 | | | 300<br>280 |
| i layer | $SiH_4$<br>$GeH_4$<br>$H_2$ | 50<br>50<br>200 | 200<br>200 ($\mu$-wave)<br>200 | 0.02 | 300 |
| p/i diffusion preventive layer | $SiH_4$<br>$GeH_4$<br>$H_2$ | 20<br>5<br>900 | 50 (RF) | 1.1 | 280<br>300<br>330 |
| p layer | $SiH_4$<br>$BF_3/H_2$ (1% dil)<br>$H_2$ | 10<br>50<br>1000 | 1000 (RF) | 1.0 | 320 |

Transparent electrode ITO ($In_2O_3$ + $SnO_2$) thin film 100 nm
Collector electrode aluminum (Al) thin film 2 $\mu$m

Comparative Example 2

This example is different from Example 1 in that the heating temperature of the belt-like substrate was kept constant during formation of the diffusion preventing layers.

Differences from Example 2 are as follows.

(1) The heating temperature of the belt-like substrate was kept constant at 300° C. during formation of the n/i diffusion preventing layer.

(2) The heating temperature of belt-like substrate was kept constant at 280° C. during formation of the p/i diffusion preventing layer.

A photovoltaic element (comparative sample No. 2) was fabricated on a roll of belt-like substrate in the same manner as in Example 2 except for the above differences.

Described in the following is the result of evaluation of the photoelectric conversion efficiency n={maximum generated power ($mW/cm_2$) per unit area/intensity of incident light per unit area ($mW/cm_2$)} of each of the photovoltaic elements (sample No. 2) obtained in Example 2 and the photovoltaic elements (comparative sample No. 2) obtained in Comparative Example 2.

Five samples were prepared for each of the photovoltaic elements of sample No. 2 and comparative sample No. 2, and they were placed under irradiation of light of AM-1.5 (100 $mW/cm^2$).

A dc voltage was applied to the output electrode 110 shown in FIG. 1 to measure the current-voltage performance, thereby evaluating the open-circuit voltage, fill factor, and photoelectric conversion efficiency n. As a result, the photovoltaic elements of sample No. 2 showed an open-circuit voltage 1.17 times on average, a fill factor 1.1 times on average, and a photoelectric conversion efficiency η 1.3 times on average greater than the photovoltaic elements of comparative sample No. 2. Thus the photovoltaic element of sample No. 2 was improved in all the characteristics.

Further, each of the photovoltaic elements manufactured in Example 2 and the photovoltaic elements (comparative sample No. 2) manufactured in Comparative Example 2 was vacuum-sealed by a protective film comprised of polyvinylidene fluoride (VDF). Then they were placed under the conditions of practical use (placed outdoors with a fixed resistance of 50 ohm being connected across both electrodes) for one year, and thereafter the evaluation of photoelectric conversion efficiency was again carried out to check the rate of degradation (which is obtained by dividing the amount of photoelectric conversion efficiency lost due to degradation by the initial photoelectric conversion efficiency) caused by irradiation of light. As a result, the degradation rate of sample No. 2 was 50% of that of comparative sample No. 2.

The above showed that the photovoltaic elements (sample No. 2 of Example 2) manufactured according to the present invention, which were photovoltaic elements with the diffusion preventing semiconductor layers of a-SiGe:H, had a significantly improved photoelectric conversion efficiency and greatly improved reliability under conditions of practical use.

Example 3

Three pin junctions were stacked in this example, whereas in Example 1 only one pin junction was provided on the surface of the lower electrode. A photovoltaic element with three pin junctions stacked as described is called a triple type photovoltaic element.

In this example, no diffusion preventing semiconductor layer was formed in the pin junction on the light incidence side and the discharge for forming the i-type semiconductor layer thereof was RF discharge. The other two pin junctions were provided with the diffusion preventing semiconductor layers formed in the same manner as in Example 1.

For manufacturing the above triple type photovoltaic element, the apparatus was arranged so that an n-type semiconductor layer forming chamber, an n/i diffusion preventing semiconductor layer forming chamber, an i-type semiconductor layer forming chamber, a p/i diffusion preventing semiconductor layer forming chamber, a p-type semiconductor layer forming chamber, an n-type semiconductor layer forming chamber, an i-type semiconductor layer forming chamber, and a p-type semiconductor layer forming chamber were added to the previous apparatus connected through a gas gate between the p-type semiconductor layer forming chamber 508 and the winding chamber 503 of the deposited film forming apparatus shown in FIG. 5.

The i-type semiconductor layers in the first and second pin junctions (from the substrate side) were made of a-SiGe:H. On the other hand, the i-type semiconductor layer in the third pin junction was made of a-Si:H. The manufacturing conditions are shown in Table 3. The stacking order is from the top to the bottom of Table 3.

TABLE 3

| Substrate | SUS 430 BA W: 300 mm T: 0.2 mm |
| Reflective layer | silver (Ag) thin film 100 nm |
| Reflection enhancing layer | zinc oxide (ZnO) thin film 1 $\mu$m |
| Gate gas | $H_2$ from each gate at 500 cc/min |

| Name of layer | | flow rate (cc/min) | | discharge power (W) | press (Torr) | substrate temperature (° C.) |
|---|---|---|---|---|---|---|
| Manufacturing conditions of each layer | n-type layer | $SiH_4$<br>$PH_3/H_2$ (1% dil)<br>$H_2$ | 100<br>500<br>700 | 100 (RF) | 1.0 | 270 |
| | n/i diffusion preventive layer | $SiH_4$<br>$H_2$ | 50<br>1000 | 50 (RF) | 1.1 | 280<br>300<br>350 |
| | i-type layer | $SiH_4$ | 50 | 200 ($\mu$-wave) | 0.02 | 360 |

TABLE 3-continued

| | | | | | |
|---|---|---|---|---|---|
| | GeH$_4$ | 50 | 200 ($\mu$-wave) | | |
| | H$_2$ | 200 | 200 ($\mu$-wave) | | |
| p/i diffusion preventive layer | SiH$_4$ | 20 | 50 (RF) | 1.1 | 350 |
| | GeH$_4$ | 7 | | | 280 |
| | H$_2$ | 900 | | | 200 |
| p-type layer | SiH$_4$ | 100 | 1000 (RF) | 1.0 | 150 |
| | BF$_3$/H$_2$ (1% dil) | 50 | | | |
| | H$_2$ | 700 | | | |
| n-type layer | SiH$_4$ | 50 | 50 (RF) | 1.0 | 220 |
| | BF$_3$/H$_2$ (1% dil) | 500 | | | |
| | H$_2$ | 1000 | | | |
| n/i diffusion preventive layer | SiH$_4$ | 50 | 50 (RF) | 1.1 | 250 |
| | H$_2$ | 1000 | | | 290 |
| | | | | | 320 |
| i-type layer | SiH$_4$ | 45 | 180 ($\mu$-wave) | 0.015 | 340 |
| | GeH$_4$ | 40 | 180 ($\mu$-wave) | | |
| | H$_2$ | 100 | 180 ($\mu$-wave) | | |
| p/i diffusion preventive layer | SiH$_4$ | 20 | 50 (RF) | 1.1 | 300 |
| | GeH$_4$ | 5 | | | 250 |
| | H$_2$ | 900 | | | 200 |
| p-type layer | SiH$_4$ | 100 | 1000 (RF) | 1.0 | 150 |
| | PH$_3$/H$_2$ (1% dil) | 500 | | | |
| | H$_2$ | 700 | | | |
| n-type layer | SiH$_4$ | 100 | 80 (RF) | 1.0 | 220 |
| | PH$_3$/H$_2$ (1% dil) | 500 | | | |
| | H$_2$ | 700 | | | |
| i-type layer | SiH$_4$ | 50 | 100 (RF) | 1.0 | 220 |
| | H$_2$ | 200 | | | |
| p-type layer | SiH$_4$ | 10 | 1000 (RF) | 1.0 | 150 |
| | BF$_3$/H$_2$ (1% dil) | 50 | | | |
| | H$_2$ | 1000 | | | |

Transparent electrode ITO (In$_2$O$_3$ + SnO$_2$) thin film 100 nm
Collector electrode aluminum (Al) thin film 2 $\mu$m Subsequently, using a continuous module forming apparatus (not shown), the photovoltaic element thus manufactured was processed into many photovoltaic element modules (in the size of 36 cm×22 cm).

The photovoltaic element modules thus processed were subjected to evaluation of their electrical characteristics using artificial solar light of the energy density 100 mW/cm$^2$ under AM 1.5, and photoelectric conversion efficiencies of 7.8 or more % were attained. Further, the dispersion in characteristics between the photovoltaic element modules was within 5%. Further, two of the photovoltaic element modules thus processed were subjected to a repetitive bending test of continuous 200 cycles. No degradation of the characteristics was observed even after the test and peeling or the like of the deposited films also was not observed. Furthermore, even after continuous 500 hr irradiation of the artificial solar light of energy density 100 mW/cm$_2$ under AM 1.5 as described above, changes in the photoelectric conversion efficiencies were within 8.5% of the initial values thereof.

A power supply system of output 5 kW was able to be constructed by connecting the above photovoltaic element modules.

Example 4

This example is different from Example 3 in that the photovoltaic elements were manufactured using aSiGe:H films, instead of the a-Si:H films, as the n/i diffusion preventing semiconductor layers and then the elements were processed into photovoltaic modules.

The other points were the same as in Example 3.

The photovoltaic modules were subjected to the same evaluation of characteristics as in Example 3. Photoelectric conversion efficiencies of 7.2 or more % were attained and the dispersion in the characteristics between the photovoltaic element modules was within 5%. No degradation of the characteristics was observed even after a repetitive bending test of continuous 200 cycles, and peeling of the deposited films also was not observed. Further, even after irradiation of the artificial solar light performed continuously for 500 hours, changes in the photoelectric conversion efficiencies were within 8.5% of the initial values thereof.

A power supply system of output 5 kW was able to be constructed using the photovoltaic element modules.

Example 5

This example is different from Example 3 in that the photovoltaic elements were manufactured using a-SiC:H films, instead of the a-SiGe:H films, as the p/i diffusion preventing semiconductor layers and then the elements were processed into the photovoltaic modules.

The other points were the same as in Example 3.

The photovoltaic modules were subjected to the same evaluation of characteristics as in Example 3. Photoelectric conversion efficiencies of 7.4 or more % were attained and the dispersion in the characteristics between the photovoltaic element modules was within 5%. No degradation of the characteristics was observed even after a repetitive bending test of continuous 200 cycles, and peeling of the deposited films also was not observed. Further, even after irradiation of the artificial solar light performed continuously for 500 hours, changes in the photoelectric conversion efficiencies were within 8.7% of the initial values thereof.

A power supply system of output 5 kW was able to be constructed using the photovoltaic element modules.

What is claimed is:

1. A method for manufacturing a photoelectric conversion element containing at least one pin junction, wherein a diffusion preventing layer is provided at least between an n-type layer and an i-type layer or between an i-type layer and a p-type layer, and each said diffusion preventing layer is deposited such that the deposition temperature varies in the thickness direction.

2. A method for manufacturing a photoelectric conversion element according to claim 1, wherein the deposition temperature is raised as a said diffusion preventing layer provided between the n-type layer and the i-type layer is deposited.

3. A method for manufacturing a photoelectric conversion element according to claim 1, wherein said deposition temperature is lowered as a said diffusion preventing layer provided between the i-type layer and the p-type layer is deposited.

4. A method for manufacturing a photoelectric conversion element according to claim 1, wherein said photoelectric conversion element is a photovoltaic element or a photosensor.

5. A method for manufacturing a photoelectric conversion element according to claim 1, wherein each said diffusion preventing layer is deposited by plasma CVD.

6. A method for manufacturing a photoelectric conversion element according to claim 1, wherein said pin junction is mainly comprised of silicon.

7. A method for manufacturing a photoelectric conversion element according to claim 1, wherein said i-type layer contains germanium.

8. A method for manufacturing a photoelectric conversion element according to claim 1, wherein said photoelectric conversion element is deposited on a belt-like substrate.

9. A method for manufacturing a photoelectric conversion element according to claim 8, wherein said substrate is a metal or a polymeric resin with an electroconductive layer on its surface.

10. A method for manufacturing a photoelectric conversion element according to claim 8, wherein said substrate is continuously moving.

11. A method for manufacturing a photoelectric conversion element according to claim 8, wherein said substrate is stationary during deposition of said layers.

12. A method for manufacturing a photoelectric conversion element according to claim 1, wherein deposition of said layers is performed in a batch process deposition chamber.

13. A method for manufacturing a photoelectric conversion element according to claim 1, wherein plural pin junctions are stacked.

14. The method for manufacturing the photoelectric conversion element according to claim 1, wherein the deposition temperature of said i-type layer is higher than that of said n-type layer or said p-type layer, and wherein the deposition temperature of a portion of said diffusion preventing layer on the side of said i-type layer is higher than that of a portion of the said diffusion preventing layer on the side of said n-type layer or said p-type layer.

15. The method for manufacturing the photoelectric conversion element according to claim 1, wherein the deposition temperature of said i-type layer is lower than that of said n-type layer or said p-type layer, and wherein the deposition temperature of a portion of said diffusion preventing layer on the side of said i-type layer is lower than that of a portion of the said diffusion preventing layer on the side of said n-type layer or said p-type layer.

16. The method for manufacturing the photoelectric conversion element according to claim 1, wherein said i-type layer is formed by microwave plasma CVD, and said n-type layer and said p-type layer are formed by RF plasma CVD.

17. A method for manufacturing a photoelectric conversion element comprising an i-type semiconductor layer and a semiconductor layer doped with a dopant, wherein a diffusion preventing layer is provided between said i-type semiconductor layer and said semiconductor layer doped with the dopant, and wherein said diffusion preventing layer is deposited such that the deposition temperature varies in the thickness direction.

18. The method for manufacturing the photoelectric conversion element according to claim 17, wherein said i-type semiconductor layer, said semiconductor layer doped with the dopant, and said diffusion preventing layer each comprise a non-single-crystal semiconductor.

19. The method for manufacturing the photoelectric conversion element according to claim 17, wherein said i-type semiconductor layer is formed of a material selected from the group consisting of amorphous Si:H, amorphous Si:F, amorphous Si:H:F, amorphous SiC:H, amorphous SiC:F, amorphous SiC:H:F, amorphous SiGe:H, amorphous SiGe:F, amorphous SiGe:H:F, polycrystalline Si:H, polycrystalline Si:F and polycrystalline Si:H:F.

20. The method for manufacturing the photoelectric conversion element according to claim 17, wherein said semiconductor layer doped with the dopant is formed by doping with a valence electron controlling agent, and wherein said semiconductor layer doped with the dopant is formed of a material selected from the group consisting of amorphous Si:H, amorphous Si:F, amorphous Si:H:F, amorphous SiC:H, amorphous SiC:F, amorphous SiC:H:F, amorphous SiGe:H, amorphous SiGe:F, amorphous SiGe:H:F, polycrystalline Si:H, polycrystalline Si:F and polycrystalline Si:H:F.

21. The method for manufacturing the photoelectric conversion element according to claim 17, wherein said diffusion preventing layer is formed of a material selected from the group consisting of amorphous Si:H, amorphous Si:F, amorphous Si:H:F, amorphous SiC:H, amorphous SiC:F, amorphous SiC.H:F, amorphous SiGe:H, amorphous SiGe:F and amorphous SiGe:H:F.

22. The method for manufacturing the photoelectric conversion element according to claim 17, wherein said diffusion preventing layer is formed by plasma CVD.

23. The method for manufacturing the photoelectric conversion element according to claim 17, wherein said i-type semiconductor layer, the semiconductor layer doped with the dopant, and the diffusion preventing layer are formed on a belt-like substrate.

24. The method for manufacturing the photoelectric conversion element according to claim 23, wherein said substrate is a metallic substrate or a polymeric resin substrate having an electroconductive layer on its surface.

25. The method for manufacturing the photoelectric conversion element according to claim 23, wherein said substrate is continuously moving.

26. The method for manufacturing the photoelectric conversion element according to claim 23, wherein said substrate is stationary during deposition of said layers.

27. The method for manufacturing the photoelectric conversion element according to claim 17, wherein deposition of said layers is performed in a batch process deposition chamber.

28. The method for manufacturing the photoelectric conversion element according to claim 17, wherein the deposition temperature of said i-type semiconductor layer is higher than that of said semiconductor layer doped with the dopant, and wherein the deposition temperature of a portion of said diffusion preventing layer on the side of said i-type semiconductor layer is higher than that of a portion of said diffusion preventing layer on the side of said semiconductor layer doped with the dopant.

29. The method for manufacturing the element according to claim 17, wherein the deposition temperature of said i-type semiconductor layer is lower than that of said semiconductor layer doped with the dopant, and wherein the deposition temperature of a portion of said diffusion preventing layer on the side of said i-type semiconductor layer is lower than that of a portion of said diffusion preventing layer on the side of said semiconductor layer doped with the dopant.

30. The method for manufacturing the element according to claim 17, wherein said i-type semiconductor layer is formed by microwave plasma CVD, and said semiconductor layer doped with the dopant is formed by RF plasma CVD.

31. A method for manufacturing a photovoltaic element comprising the steps of:
depositing an n-type semiconductor layer on a substrate;
depositing a first diffusion preventing layer on said n-type semiconductor layer;
depositing an i-type semiconductor layer on said first diffusion preventing layer;
depositing a second diffusion preventing layer on said i-type semiconductor layer; and depositing a p-type semiconductor layer on said second diffusion preventing layer;

wherein said first and second diffusion preventing layers are deposited such that the deposition temperature varies in the thickness direction.

32. The method for manufacturing the photovoltaic element according to claim 31, further comprising a step of forming a first electrode between said substrate and said n-type semiconductor layer.

33. The method for manufacturing the photovoltaic element according to claim 32, further comprising a step of forming a second transparent electrode on said p-type semiconductor layer.

34. The method for manufacturing the photovoltaic element according to claim 33, further comprising a step of forming a collector electrode on said second electrode.

35. The method for manufacturing the photovoltaic element according to claim 31, wherein said n-type semiconductor layer, said first diffusion preventing layer, said i-type semiconductor layer, said second diffusion preventing layer and said p-type semiconductor layer each comprise a non-single-crystal semiconductor.

36. The method for manufacturing the photovoltaic element according to claim 31, wherein said i-type semiconductor layer is formed of a material selected from the group consisting of amorphous Si:H, amorphous Si:F, amorphous Si:H:F, amorphous SiC:H, amorphous SiC:F, amorphous SiC:H:F, amorphous SiGe:H, amorphous SiGe:F, amorphous SiGe:F, polycrystalline Si:H, polycrystalline Si:F and polycrystalline Si:H:F.

37. The method for manufacturing the photovoltaic element according to claim 31, wherein said n-type and p-type semiconductor layers are formed by doping with a valence electron controlling agent, and wherein said n-type and p-type semiconductor layers are formed of a material selected from the group consisting of amorphous Si:H, amorphous Si:F, amorphous Si:F, amorphous SiC:H, amorphous Sic:F, amorphous SiC:H:F, amorphous SiGe:H, amorphous SiGe:F, amorphous SiGe:H:F, polycrystalline Si:H, polycrystalline Si:F and polycrystalline Si:H:F.

38. The method for manufacturing the photovoltaic element according to claim 31, wherein said first and second diffusion preventing layers are formed of a material selected from the group consisting of amorphous Si:H, amorphous Si:F, amorphous Si:H:F, amorphous SiC:H, amorphous SiC:F, amorphous SiC:H:F, amorphous SiGe:H, amorphous SiGe:F and amorphous SiGe:H:F.

39. The method for manufacturing the photovoltaic element according to claim 31, wherein said first and second diffusion preventing layers are formed by plasma CVD.

40. The method for manufacturing the photovoltaic element according to claim 31, wherein said substrate has a belt-like shape.

41. The method for manufacturing the photovoltaic element according to claim 40, wherein said substrate is continuously moving.

42. The method for manufacturing the photovoltaic element according to claim 40, wherein said substrate is stationary during deposition of said layers.

43. The method for manufacturing the photovoltaic element according to claim 31, wherein said substrate is a metallic substrate or a polymeric resin substrate having an electroconductive layer on its surface.

44. The method for manufacturing the photovoltaic element according to claim 31, wherein deposition of said layers is performed in a batch process deposition chamber.

45. The method for manufacturing the photovoltaic element according to claim 31, wherein the deposition temperature of said i-type semiconductor layer is higher than both of the deposition temperatures of said n-type and p-type semiconductor layers, wherein the deposition temperature of a portion of said first diffusion preventing layer on the side of said i-type semiconductor layer is higher than that of a portion of said first diffusion preventing layer on the side of said n-type semiconductor layer, and wherein the deposition temperature of a portion of said second diffusion preventing layer on the side of said i-type semiconductor layer is higher than that of a portion of said second diffusion preventing layer on the side of said p-type semiconductor layer.

46. The method for manufacturing the photovoltaic element according to claim 31, wherein the deposition temperature of said i-type semiconductor layer is lower than both of the deposition temperatures of said n-type and p-type semiconductor layers, wherein the deposition temperature of a portion of said first diffusion preventing layer on the side of said i-type semiconductor layer is lower than that of a portion of said first diffusion preventing layer on the side of said n-type semiconductor layer, and wherein the deposition temperature of a portion of said second diffusion preventing layer on the side of said i-type semiconductor layer is lower than that of a portion of said second diffusion preventing layer on the side of said p-type semiconductor layer.

47. The method for manufacturing the photovoltaic element according to claim 31, wherein said i-type semiconductor layer is formed by microwave plasma CVD, and said n-type and p-type semiconductor layers are formed by RF plasma CVD.

48. A method for manufacturing a photovoltaic element by introducing a gas into a plurality of vacuum chambers under plasma CVD, which comprises the steps of:

depositing an n-type semiconductor layer on a substrate by decomposing a gas comprising Si, a gas comprising P and hydrogen gas;

depositing a first semiconductor layer on said n-type semiconductor layer by decomposing a gas comprising Si and hydrogen gas;

depositing an i-type semiconductor layer on said first semiconductor layer by decomposing a gas comprising Si, a gas comprising Ge and hydrogen gas;

depositing a second semiconductor layer on said i-type semiconductor layer by decomposing a gas comprising Si and hydrogen gas; and depositing a p-type semiconductor layer on said second semiconductor layer by decomposing a gas comprising Si, a gas comprising B and hydrogen gas;

wherein said first and second semiconductor layers are deposited such that the deposition temperature varies in the thickness direction.

49. The method for manufacturing the photovoltaic element according to claim 48, further comprising a step of forming a layer comprising Ag and a layer comprising ZnO between said substrate and said n-type semiconductor layer.

50. The method for manufacturing the photovoltaic element according to claim 49, further comprising a step of forming a layer comprising ITO on said p-type semiconductor layer.

51. The method for manufacturing the photovoltaic element according to claim 50, further comprising a step of forming a collector electrode on said layer comprising ITO.

52. The method for manufacturing the photovoltaic element according to claim 48, wherein said layers deposited on said substrate each comprise a non-single-crystal semiconductor.

53. The method for manufacturing the photovoltaic element according to claim 48, wherein said substrate has a belt-like shape.

54. The method for manufacturing the photovoltaic element according to claim 53, wherein said substrate is continuously moving.

55. The method for manufacturing the photovoltaic element according to claim 53, wherein said substrate is stationary during deposition of said layers.

56. The method for manufacturing the photovoltaic element according to claim 48, wherein said substrate is a metallic substrate or a polymeric resin substrate having an electroconductive layer on its surface.

57. The method for manufacturing the photovoltaic element according to claim 48, wherein deposition of said layers is performed in a batch process deposition chamber.

58. The method for manufacturing the photovoltaic element according to claim 48, wherein the deposition temperature of said i-type semiconductor layer is higher than both of the deposition temperatures of said n-type and p-type semiconductor layers, wherein the deposition temperature of a portion of said first semiconductor layer on the side of said i-type semiconductor layer is higher than that of a portion of said first semiconductor layer on the side of said n-type semiconductor layer, and wherein the deposition temperature of a portion of said second semiconductor layer on the side of said i-type semiconductor layer is higher than that of a portion of said second semiconductor layer on the side of said p-type semiconductor layer.

59. The method for manufacturing the photovoltaic element according to claim 48, wherein the deposition temperature of said i-type semiconductor layer is lower than both of the deposition temperatures of said n-type and p-type semiconductor layers, wherein the deposition temperature of a portion of said first semiconductor layer on the side of said i-type semiconductor layer is lower than that of a portion of said first semiconductor layer on the side of said n-type semiconductor layer, and wherein the deposition temperature of a portion of said second semiconductor layer on the side of said i-type semiconductor layer is lower than that of a portion of said second semiconductor layer on the side of said p-type semiconductor layer.

60. The method for manufacturing the photovoltaic element according to claim 48, wherein said i-type semiconductor layer is formed by microwave plasma CVD, and said n-type and p-type semiconductor layers are formed by RF plasma CVD.

* * * * *

UNITED STATES PATENT AND TRADEMARK OFFICE
CERTIFICATE OF CORRECTION

PATENT NO. : 5,897,332

DATED : April 27, 1999

INVENTOR(S): TADASHI HORI, ET AL.

It is certified that error appears in the above-identified patent and that said Letters Patent is hereby corrected as shown below:

COLUMN 2

Line 1, "a" should be deleted.

COLUMN 3

Line 17, "e-layers" should read --n-layers--; and
    Line 49, "A-Si:H:F," should read --a-Si:H:F,--.

COLUMN 6

Line 46, "device," should read --the device,--;
    Line 53, "inbetween)." should read --in between).--; and
    Line 60, "formed" (first occurrence) should be deleted.

COLUMN 7

Line 9, "inbetween" should read --in between--; and
    Line 13, "fluoride based" should read --fluoride-based--.

UNITED STATES PATENT AND TRADEMARK OFFICE
CERTIFICATE OF CORRECTION

PATENT NO. : 5,897,332

DATED : April 27, 1999

INVENTOR(S): TADASHI HORI, ET AL.

It is certified that error appears in the above-identified patent and that said Letters Patent is hereby corrected as shown below:

COLUMN 8

Line 48, "Photovoltaic" should read --photovoltaic--.

COLUMN 15

Line 57, "100 mW/cm$_2$" should read --100 mW/cm$^2$--.

COLUMN 18

Line 12, "SiC.H:F," should read --SiC:H:F,--;
    Line 45, "element" should read
        --photoelectric conversion element--; and
    Line 54, "element" should read
        --photoelectric conversion element--.

UNITED STATES PATENT AND TRADEMARK OFFICE
CERTIFICATE OF CORRECTION

PATENT NO. : 5,897,332

DATED : April 27, 1999

INVENTOR(S): TADASHI HORI, ET AL.

It is certified that error appears in the above-identified patent and that said Letters Patent is hereby corrected as shown below:

<u>COLUMN 19</u>

Line 28, "SiGe:F," should read --SiGe:H:F,--;
Line 36, "amorphous Si:F," (second occurrence)
    should read --amorphous Si:H:F,--; and
Line 37, "Sic:F," should read --SiC:F,--.

Signed and Sealed this

First Day of February, 2000

Attest:

Q. TODD DICKINSON

Attesting Officer     Acting Commissioner of Patents and Trademarks